(12) United States Patent
Mao et al.

(10) Patent No.: US 8,477,551 B1
(45) Date of Patent: Jul. 2, 2013

(54) OPTICAL MEMORY

(75) Inventors: Samuel S. Mao, Castro Valley, CA (US);
Yanfeng Zhang, Mountain View, CA (US)

(73) Assignee: U.S. Department of Energy, Washington, DC (US)

( * ) Notice: Subject to any disclaimer, the term of this patent is extended or adjusted under 35 U.S.C. 154(b) by 117 days.

(21) Appl. No.: 13/288,152

(22) Filed: Nov. 3, 2011

(51) Int. Cl.
*G11C 13/04* (2006.01)

(52) U.S. Cl.
USPC .................. 365/215; 365/114; 365/234

(58) Field of Classification Search
USPC ................... 365/215, 114, 234, 189.07
See application file for complete search history.

(56) References Cited

U.S. PATENT DOCUMENTS

| | | | |
|---|---|---|---|
| 3,523,208 A | 8/1970 | Bodmer et al. | |
| 3,858,232 A | 12/1974 | Boyle et al. | |
| 4,187,000 A * | 2/1980 | Constant | 359/107 |
| 5,579,258 A | 11/1996 | Adachi | |
| 5,740,117 A * | 4/1998 | Bona et al. | 365/215 |
| 6,005,791 A * | 12/1999 | Gudesen et al. | 365/114 |
| 7,569,941 B2 | 8/2009 | Majumder et al. | |
| 2007/0171749 A1* | 7/2007 | Frommer | 365/215 |

FOREIGN PATENT DOCUMENTS

WO    2008/143727 A2    11/2008

* cited by examiner

*Primary Examiner* — Huan Hoang
(74) *Attorney, Agent, or Firm* — Michael J. Dobbs; Daniel D. Park; John T. Lucas

(57) ABSTRACT

Optical memory comprising: a semiconductor wire, a first electrode, a second electrode, a light source, a means for producing a first voltage at the first electrode, a means for producing a second voltage at the second electrode, and a means for determining the presence of an electrical voltage across the first electrode and the second electrode exceeding a predefined voltage. The first voltage, preferably less than 0 volts, different from said second voltage. The semiconductor wire is optically transparent and has a bandgap less than the energy produced by the light source. The light source is optically connected to the semiconductor wire. The first electrode and the second electrode are electrically insulated from each other and said semiconductor wire.

22 Claims, 4 Drawing Sheets

OPTICAL MEMORY

GOVERNMENT INTERESTS

The United States Government has rights in this invention pursuant to Contract No. DE-AC03-765F00098, between the U.S. Department of Energy (DOE) and the University of California at Berkeley.

CROSS-REFERENCE TO RELATED APPLICATIONS

Field of the Invention

The present invention relates to a method and device for optical data storage.

BACKGROUND OF THE INVENTION

As the size and popularity of digital videos, images, databases, etc. increase in size, existing data storage techniques have scaled relatively well thus far. However, new digital storage techniques need to be developed, particularly to handle new advances in optical electronics.

Advancements in optical electronics, for example quantum optical computers and optical communication equipment (e.g. optical switches), have generated a need for fast, direct optical storage techniques. Current optical storage techniques generally employ either a cavity in which light is folded back and forth, a coil of optical fiber with enough optical path length, or Anderson localization (extending light path by highly scattering media). Although somewhat easy to implement, these techniques are plagued by a finite storage life and large size (due to the long optical path lengths for storage life).

Therefore, there is a need in the art for an optical data storage means that provides for fast and long-term data storage.

SUMMARY OF THE INVENTION

Optical memory comprising: a semiconductor wire, a first electrode, a second electrode, a light source, a means for producing a first voltage to the first electrode, a means for producing a second voltage to the second electrode, and a means for determining the presence of an electrical voltage across the first electrode and the second electrode exceeding a predefined voltage. The first voltage is different than the second voltage.

The semiconductor wire is essentially optically transparent and has a bandgap less than the energy of the light produced by the light source and greater than background ambient light (light, electromagnetic radiation, etc.). The light source is optically connected to the semiconductor wire. The first electrode is electrically conductive and electrically insulated from the semiconductor wire. The second electrode is electrically conductive and electrically insulated from the semiconductor wire. Preferably, at least part of the first electrode is at a distance less than 5 nm, more preferably 1 nm, from the semiconductor wire. Preferably, at least part of the second electrode is at a distance less than 5 nm, more preferably 1 nm, from the semiconductor wire.

The first electrode and the second electrode are electrically insulated from each other. The means for producing a first voltage electrically is electrically connected to the first electrode. Preferably, the first voltage is less than 0 volts (system ground voltage). The means for producing a second voltage is electrically connected to the second electrode. Preferably, the second voltage is greater than 0 volts (system ground voltage). The means for determining the presence of an electrical voltage across the first electrode and the second electrode exceeding a predefined voltage is electrically connected to the first electrode and the second electrode.

The first electrode and the second electrode produce an electric field across the semiconductor wire thereby creating a lateral electrostatic potential modulation within the semiconductor wire. When the semiconductor wire is optically excited, the photo-generated electrons and holes in the semiconductor wire spatially separate. The separated electrons and holes in the semiconductor wire then align with the lateral electrostatic until the lateral electrostatic potential modulation is removed. Therefore, an optical pulse can be determined and stored within the semiconductor wire for an infinite amount of time as long as the lateral electrostatic potential modulation remains.

The resulting electrical voltage across the first electrode and the second electrode from the separated charges can then be detected by the means for determining the presence of an electrical voltage across the first electrode and the second electrode exceeding a predefined voltage. Preferably, the means for determining the presence of an electrical voltage across the first electrode and the second electrode exceeding a predefined voltage uses a volt meter, ADC (analog-to-digital-converter), or other voltage measuring means to detect the voltage between the first electrode and the second electrode.

The passing of light through the semiconductor wire, optically excites the semiconductor wire, thereby generating photo-generated electrons and holes in the semiconductor wire, which can be detected by the voltage across the first electrode and the second electrode. If the detected voltage across the first electrode and the second electrode exceed a predefined voltage, then light has passed through the semiconductor wire since the first voltage and second voltage have been applied to the first electrode and second electrode respectively. Therefore, if a logical '0' bit or '1' bit is defined as light or the absence of light, any number of bits may be stored. Preferably, a plurality of bits are stored by a plurality of semiconductor wires. In the alternative, a plurality of bits may be detected by a single semiconductor wire, whereby the semiconductor wire serves only as a temporary storage. In one embodiment, multiple pulses may be detected by a single wire, and are electronically stored for later retrieval using existing storage techniques (electronic or mechanical, for example magnetic hard disk, flash memory etc. . . . )

DETAILED DESCRIPTION OF THE INVENTION

Figure 1A:
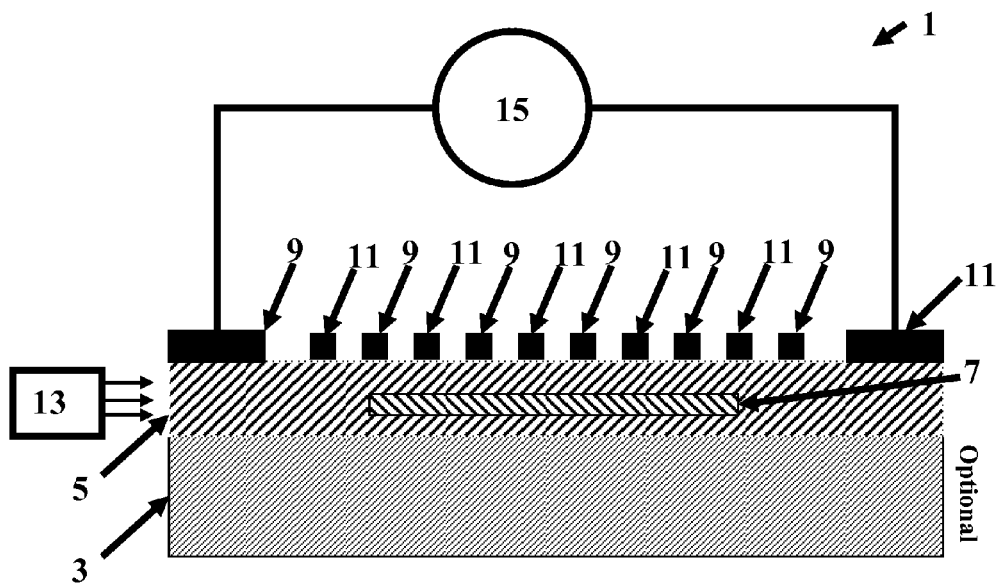
FIG. 1a depicts a cutout view of the side of one embodiment of optical memory having a first electrode and a second electrode on top of a semiconductor wire.

Optical memory comprising: a semiconductor wire, a first electrode, a second electrode, a light source, a means for producing a first voltage to the first electrode, a means for producing a second voltage to the second electrode, and a means for determining the presence of an electrical voltage across the first electrode and the second electrode exceeding a predefined voltage. The first voltage is different than the second voltage.

The semiconductor wire is essentially optically transparent and has a bandgap less than the energy of the light produced by the light source and greater than background ambient light (light, electromagnetic radiation, etc.). The light source is optically connected to the semiconductor wire. The first electrode is electrically conductive and electrically insulated from the semiconductor wire. The second electrode is electrically conductive and electrically insulated from the semiconductor wire. Preferably, at least part of the first electrode is at a distance less than 5 nm, more preferably 1 nm, from the semiconductor wire. Preferably, at least part of the second electrode is at a distance less than 5 nm, more preferably 1 nm, from the semiconductor wire.

The first electrode and the second electrode are electrically insulated from each other. The means for producing a first voltage electrically is electrically connected to the first electrode. Preferably, the first voltage is less than 0 volts (system ground voltage). The means for producing a second voltage is electrically connected to the second electrode. Preferably, the second voltage is greater than 0 volts (system ground voltage). The means for determining the presence of an electrical voltage across the first electrode and the second electrode exceeding a predefined voltage is electrically connected to the first electrode and the second electrode.

The first electrode and the second electrode produce an electric field across the semiconductor wire thereby creating a lateral electrostatic potential modulation within the semiconductor wire. When the semiconductor wire is optically excited, the photo-generated electrons and holes in the semiconductor wire spatially separate. The separated electrons and holes in the semiconductor wire then align with the lateral electrostatic until the lateral electrostatic potential modulation is removed. Therefore, an optical pulse can be determined and stored within the semiconductor wire for an infinite amount of time as long as the lateral electrostatic potential modulation remains.

The resulting electrical voltage across the first electrode and the second electrode from the separated charges can then be detected by the means for determining the presence of an electrical voltage across the first electrode and the second electrode exceeding a predefined voltage. Preferably, the means for determining the presence of an electrical voltage across the first electrode and the second electrode exceeding a predefined voltage uses a volt meter, ADC (analog-to-digital-converter), or other voltage measuring means to detect the voltage between the first electrode and the second electrode.

The passing of light through the semiconductor wire, optically excites the semiconductor wire, thereby generating photo-generated electrons and holes in the semiconductor wire, which can be detected by the voltage across the first electrode and the second electrode. If the detected voltage across the first electrode and the second electrode exceed a predefined voltage, then light has passed through the semiconductor wire since the first voltage and second voltage have been applied to the first electrode and second electrode respectively. Therefore, if a logical '0' bit or '1' bit is defined as light or the absence of light, any number of bits may be stored. Preferably, a plurality of bits are stored by a plurality of semiconductor wires. In the alternative, a plurality of bits may be detected by a single semiconductor wire, whereby the semiconductor wire serves only as a temporary storage. In one embodiment, multiple pulses may be detected by a single wire, and are electronically stored for later retrieval using existing storage techniques (electronic or mechanical, for example magnetic hard disk, flash memory etc. . . . )

Semiconductor Wire

The semiconductor wire is essentially optically transparent and has a bandgap less than the energy of the light produced by the light source and greater than background ambient light (light, electromagnetic radiation, etc.). The semiconductor wire is essentially optically transparent in that it allows at least some of the light (even diffused light) produced by the light source to pass through the semiconductor wire with or without attenuation (s) and with or without phase shift(s). The light source is optically connected to the semiconductor wire. Preferably, the semiconductor wire has a bandgap ($E_g$) greater than 0.5 ev to prevent any electromagnetic noise from exciting the material. Preferably, the semiconductor wire is made out of Si ($E_g$=1.11 eV), GaAs ($E_g$=1.43 eV), InP ($E_g$=1.35 eV), CdSe ($E_g$=1.73 eV), GaN ($E_g$=3.4 eV), ZnO ($E_g$=3.37 eV), or other semiconductors that are able to generate electrons and holes upon irradiation of light, or a combination thereof.

Preferably, the semiconductor wire is a cylindrical wire having a diameter less than one micron, more preferably less than 100 nm.

First Electrode

The first electrode is electrically conductive. Preferably the First electrode is made out of a thin layer of metal or of a transparent conducting oxide. Preferably, the First electrode is made out of Ag, Cu, Au, Al, Ni, Zn, Sn, Fe, Al, or transparent conducting oxides, ITO, SnO, ZnO, Al-doped ZnO or alloys or doped compounds thereof, or a combination thereof. Preferably, the First electrode is a thin (preferably less than 10 nm in thickness) layer, whereby light is able to penetrate through to the semiconductor wire. In a preferred embodiment, the first electrode is made out of ITO, or metal nano-tapes prepared by nano-deposition, more preferably ZnO.

Preferably, the first electrode comprises one or more digit sections running orthogonal to the length of the semiconductor wire. Preferably, each of the one or more digit sections of the first electrode is at a distance less than 5 nm, more preferably 1 nm, from the semiconductor wire. In a preferred embodiment, the one or more digit sections of the first electrode comprises a plurality of digit sections each running orthogonal to the length of the semiconductor wire.

Second Electrode

The second electrode is electrically conductive. Preferably the second electrode is made out of a thin layer of metal or of a transparent conducting oxide. Preferably, the second electrode is made out of Ag, Cu, Au, Al, Ni, Zn, Sn, Fe, Al, or transparent conducting oxides, ITO, SnO, ZnO, Al-doped ZnO or alloys or doped compounds thereof, or a combination thereof. Preferably, the second electrode is a thin (preferably less than 10 nm in thickness) layer, whereby light is able to penetrate through to the semiconductor wire. In a preferred embodiment, the second electrode is made out of ITO, or metal nano-tapes prepared by nano-deposition, more preferably ZnO.

Preferably, the second electrode comprises one or more digit sections running orthogonal to the length of the semiconductor wire. Preferably, each of the one or more digit sections of the second electrode is at a distance less than 5 nm, more preferably 1 nm, from the semiconductor wire. In a preferred embodiment, the one or more digit sections of the second electrode comprises a plurality of digit sections each running orthogonal to the length of the semiconductor wire. Preferably, each digit of the first electrode is separated by a corresponding digit from the second electrode. Alternately, in another embodiment, each digit of the second electrode is separated by a corresponding digit from the first electrode.

Electrical Insulator

The first electrode is electrically insulated from the second electrode using an electrical insulator. The semiconductor wire is also electrically insulated from both the first electrode and the second electrode using an electrical insulator. These electrical insulators are any material which resists the flow of electrons. Preferably, the electrical insulators are air, transparent polymers, plastics, ceramics, glasses, or combinations thereof. In a preferred embodiment, semiconductor wire is electrically insulated from the first electrode and the second electrode by an insulating layer surround the semiconductor, whereby the semiconductor wire is electrically insulated from the first electrode and the second electrode. Preferably, the insulating layer completely surrounds the semiconductor wire. Preferably, the insulating layer comprises $SiO_2$. In a preferred embodiment, the first electrode is electrically insulated from the second electrode by air, $SiO_2$ or a combination thereof.

Light Source

The light source is any means of generating light at an energy higher than the bandgap of the semiconductor wire. In one embodiment, the light source is an optical signal for storage. Preferred embodiments include one or more optical connections to an optical communications switch or device.

In an alternate embodiment, the light source is a means for generating light connected to an electrical system (e.g. a memory controller). Preferably the means for generating light is an LED (light emitting diode), however other light sources may be used, e.g. incandescent, xenon, led, florescent, laser, OLED (organic LED, etc.).

In a preferred embodiment, the first electrode or the second electrode is made of an optically transparent material and the light produced by the light source is directed through the electrode made of optically transparent material. In an alternative embodiment, neither the first electrode or second electrode is optically transparent, and the light produced by the light source is directed between the first electrode and the second electrode. In yet another embodiment, both the first electrode and the second electrode are optically transparent.

Means for Determining the Presence of an Electrical Voltage Across the First Electrode and the Second Electrode Exceeding a Predefined Voltage The means for determining the presence of an electrical voltage across the first electrode and the second electrode comprises a means for detecting the voltage across the corresponding electrode and comparing it to a predefined voltage. The means for detecting the electrical voltage across the first electrode and the second electrode is electrically connected to the first electrode and the second electrode. Preferably, the means for detecting the electrical voltage across the first electrode and the second electrode is a volt meter or ADC (analog-to-digital-converter).

A predefined voltage is selected as a significant electrical voltage across the first electrode and the second electrode. Preferably, the predefined voltage is the minimum voltage created after light from the light source passes through the semiconductor wire, while the first voltage is applied to the first electrode and the second voltage is applied to the second electrode. Preferably, the predefined voltage is greater than 0.001 volts.

Preferably, the detected voltage across the first electrode and the second electrode is compared to the predefined voltage via one or more comparators, ASICs, microcontrollers, ADCs, etc.

Means for Producing a First Voltage

The means for producing a first voltage comprises any means capable of supplying a first voltage to the first electrode. The first voltage is different from the second voltage. Preferably, the first voltage is less than zero volts (the supplied system ground), whereby the first electrode is preferably held with an excess of electrons (negative voltage), whereby any free holes (freed from excitation from the light from the light source) within the semiconductor wire will be drawn to the first electrode, thereby avoiding recombination and remaining at a detectable state.

Preferably, the means of supplying a first voltage comprises a battery, fuel cell, solar cell, magnet based generator, or other power supply means. In a preferred embodiment, a switched power supply connected to a power source (local power company grid) is used to produce the desired voltage. Preferably the desired voltage is determined using factors such as the semiconductor wire material type, size, dimension, proximity of the first electrode to the semiconductor, insulating material between the first electrode and the semiconductor wire, insulating material between the first electrode and the second electrode, first electrode material, first electrode shape and size (including length, width, and thickness), etc.

In one embodiment, the first voltage source produces a DC (direct current) voltage, for example using a switching DC power supply preferably plugged into the local power company grid. In this embodiment, preferably an electrical switch is between the first voltage source and the first electrode to selectively apply the first voltage to the first electrode and selectively, electrically disconnect the first voltage from the first electrode.

In another embodiment, the first voltage source produces an AC (alternating current) whereby the first voltage is constantly changing. This embodiment may be preferred in embodiments where the semiconductor wire is to be continually reset (by the removal of a substantially negative voltage). In this embodiment, the presence of free electrons and holes captured at the first electrode and second electrode are preferably stored using other various data storage means (capacitors, flash memory, magnetic storage, or combinations thereof). This embodiment may be preferable in situations where existing non-optical data storage means are sufficient or even desired, but are unable to sufficiently fulfill timing requirements for data storage. In this embodiment, the optical memory serves as a temporary memory means with a predefined lifespan. Preferably, in this embodiment, a plurality of semiconductor wires are used to capture the existence of light passing through the semiconductor wire and are subsequently read in batch for processing, storage or a combination thereof.

Means for Producing a Second Voltage

The means for producing a second voltage comprises any means capable of supplying a second voltage to the second electrode. The first voltage is different from the second voltage. Preferably, the second voltage is greater than zero volts (supplied system ground), whereby the second electrode is held with an excess of holes (electron deficiency), whereby any free electrons (freed from excitation from the light from the light source) within the semiconductor wire will be drawn to the more electron deficient second electrode, thereby avoiding recombination and remaining at a detectable state.

Preferably, the means of supplying a second voltage comprises a battery, fuel cell, solar cell, magnet based generator, or other power supply means. In a preferred embodiment, a switched power supply connected to a power source (local power company grid) is used to produce the desired voltage. Preferably the desired voltage is determined using factors such as the semiconductor wire material type, size, dimension, proximity of the second electrode to the semiconductor, insulating material between the second electrode and the semiconductor wire, insulating material between the second electrode and the second electrode, second electrode material, second electrode shape and size (including length, width, and thickness), etc.

In one embodiment, the second voltage source produces a DC (direct current) voltage, for example using a switching DC power supply preferably plugged into the local power company grid. In this embodiment, preferably an electrical switch is between the second voltage source and the second electrode to selectively apply the second voltage to the second electrode and selectively, electrically disconnect the second voltage from the second electrode.

In another embodiment, the second voltage source produces an AC (alternating current) whereby the second voltage is constantly changing. This embodiment may be preferred in embodiments where the semiconductor wire is to be continually reset (by the removal of a substantially negative voltage). In this embodiment, the presence of free electrons and holes captured at the second electrode and second electrode are preferably stored using other various data storage means (capacitors, flash memory, magnetic storage, or combinations thereof). This embodiment may be preferably in situations where existing non-optical data storage means are sufficient or even desired, but are unable to sufficiently fulfill timing requirements for data storage. In this embodiment, the optical memory serves as a temporary memory means with a predefined lifespan. Preferably, in this embodiment, a plurality of semiconductor wires are used to capture the existence of light passing through the semiconductor wire and are subsequently read in batch for processing, storage or a combination thereof.

In an alternate embodiment, the same power supply may be used to provide the first voltage for the first electrode and the second voltage for the second electrode. For example, a single device may reuse various components to produce multiple voltages, or the device may itself produce a first voltage and second voltage suitable for operation.

Figure 1B:
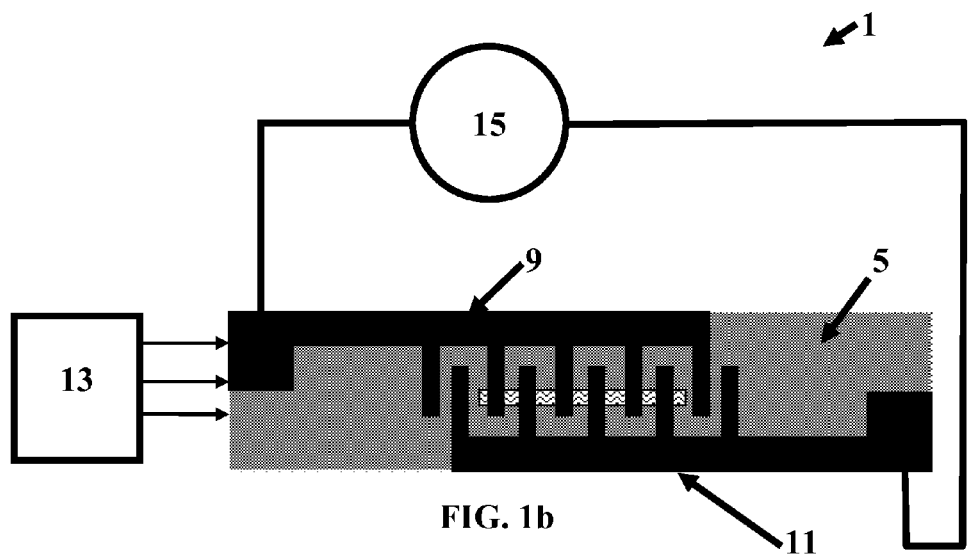
FIG. 1b depicts a top view of one embodiment of optical memory.

FIG. 1a and FIG. 1b

FIG. 1a depicts a cutout view of the side of one embodiment of optical memory 1. FIG. 1b depicts a top view of one embodiment of optical memory 1. The Optical memory 1 comprises: an insulator 5, a semiconductor wire 7, a first electrode 9, a second electrode 11, a light source 13, a memory controller 15, and preferably a substrate 3. In the embodiment shown in FIG. 1a, and FIG. 1b, the insulator 5 is positioned between the first electrode 9 and the substrate 3. In the embodiment shown in FIG. 1a, and FIG. 1b, the insulator 5 is also positioned between the second electrode 11 and the substrate 3. The semiconductor wire 7 is completely encapsulated by the insulator 5, whereby the insulator 5 completely surrounds the semiconductor wire 7. Finally, the first electrode 9 is electrically insulated from the second electrode 11, as described above, more preferably by air, or Si.

Preferably, the semiconductor wire 7, the first electrode 9, and the second electrode 11 are positioned in on the substrate 3 (not shown in FIG. 1b due to view perspective) to provide structural integrity of the semiconductor wire 7, the first electrode 9, and the second electrode 11. In the alternative, the substrate 3 may be omitted, preferably when the semiconductor wire 7, the insulator 5, the first electrode 9, and the second electrode 11. The substrate 3 is preferably made of a rigid material, preferably a metal, ceramic, plastic or glass. In a preferred embodiment, the substrate 3 is made out of Si.

Preferably, at least part of the first electrode 9 is at a distance less than 5 nm, more preferably 1 nm, from the semiconductor wire. Preferably, at least part of the second electrode 11 is at a distance less than 5 nm, more preferably 1 nm, from the semiconductor wire.

Preferably, the first electrode 9 has a plurality of digits, each digit running perpendicular to the length of the semiconductor wire 7. Preferably, the second electrode 11 has a plurality of digits, each digit running perpendicular to the length of the semiconductor wire 7. In a preferred embodiment, the first electrode 9 has a plurality of digits and the second electrode 11 has a plurality of digits, and the digits are aligned in an alternating order, whereby the electrodes are interdigitated, for example as shown in FIG. 1b. Preferably, the first electrode 9 has a plurality of digits and the second electrode 11 has a plurality of digits, and the digits are aligned coplanar in an alternating order, whereby the electrodes are interdigitated, for example as shown in FIG. 1b.

The light source 13 is as described above. Preferably, the light source 13 is an LED (light emitting diode).

Memory Controller 15

The memory controller 15 comprises a means for producing a first voltage, a means for producing a second voltage, and a means for detecting the electrical voltage between the first electrode 9 and second electrode 11. The means for producing a first voltage is electrically is connected to the first electrode 9. The means for producing a second voltage is electrically connected to the second electrode 11. The means for detecting the electrical voltage across the first electrode 9 and the second electrode 11 is electrically connected to the first electrode 9 and the second electrode 11.

Preferably, the memory controller 15 is an ASIC (Application Specific Integrated Circuit), microcontroller, computer, or other electronic device. In one embodiment, the memory controller 15 is microcontroller, for example an ATMega128, whereby the microcontroller supplies a signal to selectively power the first electrode with the first voltage, and selectively power the second electrode with the second voltage. Preferably, one or more electrical switches (BJT, MOSFET, solid-state-relays, relays etc.) are electrically connected to the means for producing a first voltage, means for producing a second voltage, or combination thereof, whereby the memory controller supplies a signal to the electrical switches which supplies the first voltage to the first electrode, supplies the second voltage to the second electrode, or a combination thereof.

In the alternative, the memory controller 15, preferably having a DAC (digital analog convertor), a PWM (pulse with modulator), or other signal generation means, is directly connected to the first electrode 9, the second electrode 11, or a combination thereof, whereby the memory controller 15 directly supplies power to the first electrode 9, the second electrode 11, or a combination thereof.

Preferably, supplementary electronics (e.g. op-amps, transistors, ASICs, etc.) are used to generate the first voltage, as voltages less than zero may not be readily available from a chosen microcontroller or ASIC. In this embodiment, preferably, an op-amp circuit is designed to produce a negative voltage relative to a voltage produce by the memory controller 15 or produce a predetermined signal or the second voltage at the direction of the memory controller 15. In one embodiment, the memory controller 15 is electrically connected to an electrical switch (e.g. solid-state-relay) to a negative voltage regulator (for example a LM320L) to selectively power the first electrode at the direction of the memory controller 15. In another embodiment, a DAC (digital to analog converter) output is connected to a circuit designed to produce a negative voltage relative to an input voltage (e.g. an inverting amplifier).

In one embodiment, the means for generating a first voltage and a second voltage is a photovoltaic device positioned around the nanowire, whereby energy generated by the photovoltaic device is used as or to generate the first voltage, the second voltage, or a combination thereof.

FIG. 2a

Figure 2A:
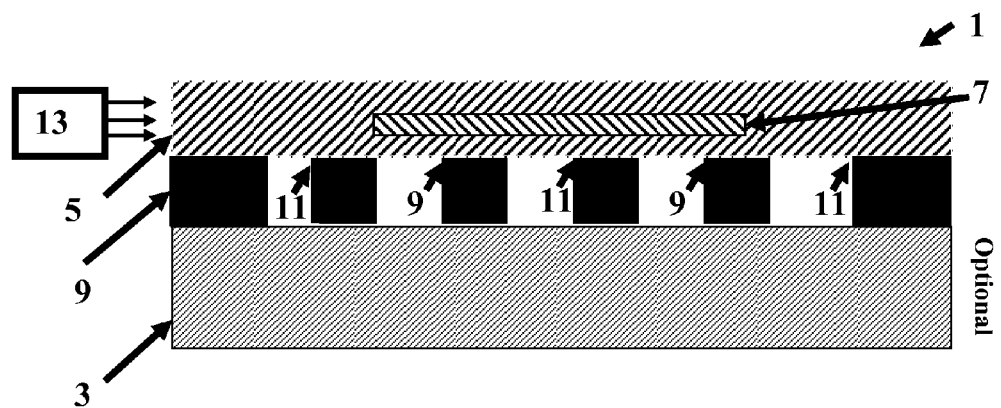
FIG. 2a depicts a cutout view of the side of one embodiment of optical memory having a first electrode and a second electrode on the bottom of a semiconductor wire.

FIG. 2a depicts a cutout view of the side of one embodiment of optical memory having a first electrode and a second electrode on the bottom of a semiconductor wire. As shown in FIG. 2a, the optical memory 1 comprises: an insulator 5, a semiconductor wire 7, a first electrode 9, a second electrode 11, a light source 13, and preferably a substrate 3, as described above. In FIG. 2a, the memory controller 15 is omitted for simplicity. In FIG. 2a, the first electrode 9 and the second electrode 11 are positioned on the bottom of the semiconductor wire 7, between the optional substrate 3 and the insulator 5 (and the semiconductor wire 7).

FIG. 2b

Figure 2B:
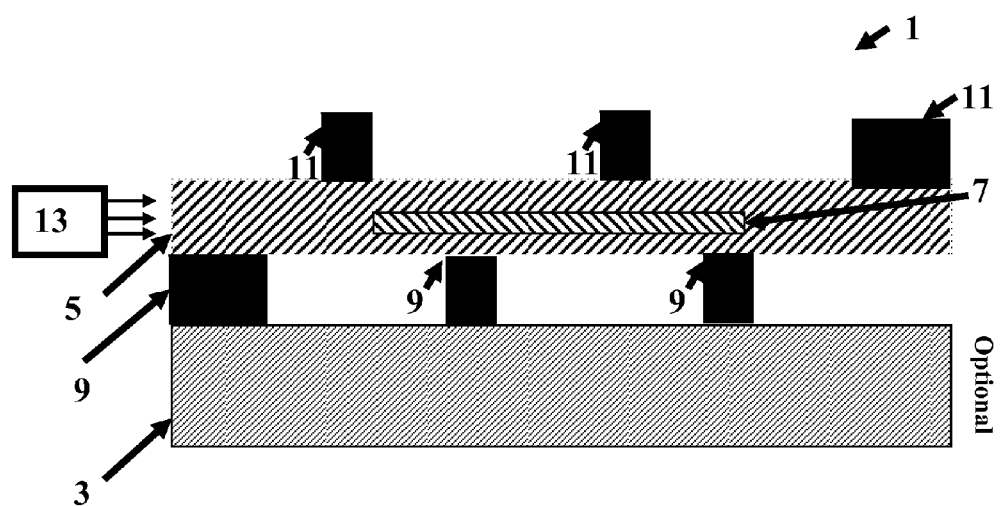
FIG. 2b depicts a cutout view of the side of one embodiment of optical memory having a first electrode on top and a second electrode on the bottom of a semiconductor wire.

FIG. 2b depicts a cutout view of the side of one embodiment of optical memory having a first electrode on top and a second electrode on the bottom of a semiconductor wire. As shown in FIG. 2b, the optical memory 1 comprises: an insulator 5, a semiconductor wire 7, a first electrode 9, a second electrode 11, a light source 13, and a substrate 3, as described above. In FIG. 2b, the memory controller 15 is omitted for simplicity. In FIG. 2b, the first electrode 9 is positioned on top of the insulator 5 (and the semiconductor wire 7). In FIG. 2b, the second electrode 11 is positioned on the bottom of the semiconductor wire 7, between the optional substrate 3 and the insulator 5 (and the semiconductor wire 7).

FIG. 3a

Figure 3A:
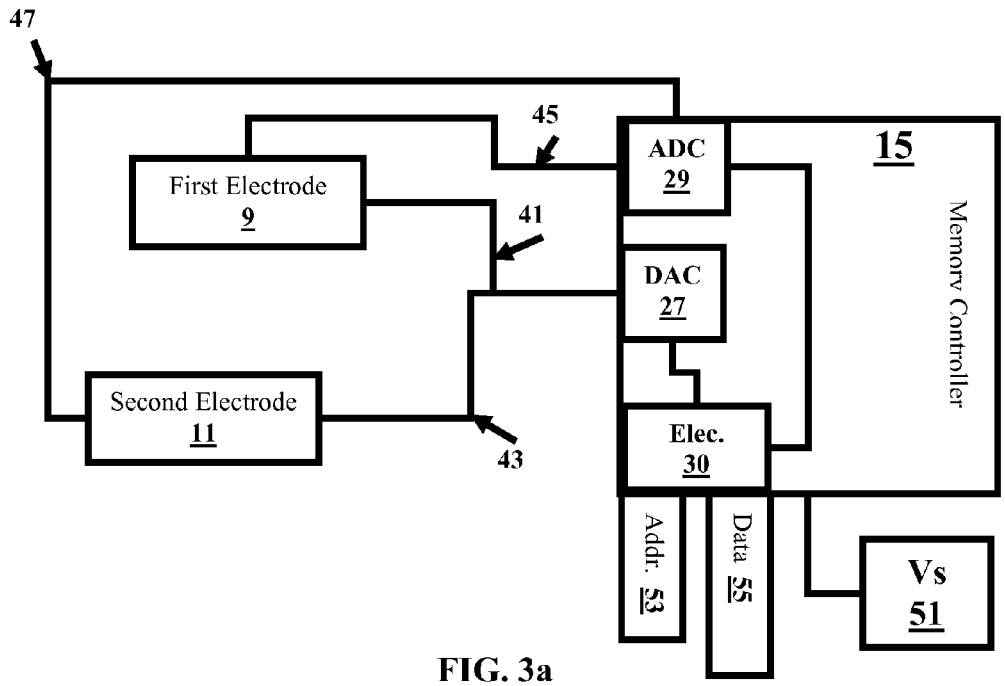
FIG. 3a depicts a block diagram of one embodiment of a memory controller comprising one or more ADCs, DACs and other electronics.

FIG. 3a depicts a block diagram of one embodiment of a memory controller comprising one or more ADCs, DACs and other electronics. In this embodiment, the memory controller 15 comprises other electronics 30, one or more DACs (Digital-to-analog-converters) 27 and one or more ADCs (Analog-to-digital-converters) 29. The other electronics 30 are connected to both the one or more DACs (Digital-to-analog-converters) 27 and one or more ADCs (Analog-to-digital-converters) 29. The first electrode 9 is electrically connected to one or more DACs 27 via a first DAC wire 41. The second electrode 11 is electrically connected to one or more DACs 27 via a second DAC wire 43. The first electrode 9 is electrically connected to one or more ADCs 29 via a first ADC wire 45. The second electrode 11 is electrically connected to one or more ADCs 29 via a second ADC wire 47. A voltage source 51 provides a voltage to the memory controller 15 (the other electronics 30, one or more DACs 27 and one or more ADCs 29 and any other components). In a preferred embodiment, the memory controller 15 comprises an ASIC (Application Specific Integrated Circuit), microcontroller, computer, or other electronic device comprising one or more ADCs 29, DACs 27, and other electronics 30, preferably a microcontroller such as the ATMEGA128 sold by ATMEL. An address input 53 and a data line 55 are connected to the other electronics 30.

One or More DACs 27

The one or more DACs 27 are any device/means capable of converting the voltage between the first electrode 9 and the second electrode 11 into a digital representation proportional to the magnitude of the voltage between the first electrode 9 and the second electrode 11. In one embodiment, only a single DAC is used, whereby the first electrode 9 and the second electrode 11 are connected to corresponding pins. In an alternate embodiment, the first electrode 9 is connected to a first DAC, and the second electrode 11 is connected to a second DAC, whereby the difference between the respective values from the first DAC and the second DAC is preferably calculated by the other electronics 30. In a preferred embodiment, the memory controller 15 is an ASIC (Application Specific Integrated Circuit), microcontroller, computer, or other electronic device comprising amongst other electronic components, one or more DACs 27, preferably a microcontroller such as the ATMEGA128 sold by ATMEL. In an alternate embodiment, the one or more DACs 27 are external to the memory controller 15. In this embodiment, the one or more DACs are preferably one or more 8 or 16 bit DACs, for example the 16-bit DAC sold by TEXAS INSTRUMENTS as ADS1115.

One or More ADCs 29

The one or more ADCs (Analog-to-digital-converters) 29 is any device/means capable of converting a digital representation to a voltage at the first electrode 9, the second electrode 11, or a combination thereof proportional to a supplied digital value. In a preferred embodiment, the memory controller 15 is an ASIC (Application Specific Integrated Circuit), microcontroller, computer, or other electronic device comprising amongst other electronic components, a ADC, preferably an microcontroller such as the ATMEGA128 sold by ATMEL. In an alternate embodiment, the one or more ADCs are external to the memory controller 15. Preferably, the one or more ADCs 29 are one or more 8 or 16 bit ADCs.

Voltage Source 51

The voltage source 51 supplies the necessary electrical voltage to power the memory controller. Preferably the voltage source 51 comprises a battery, fuel cell, solar cell, electromagnetic generator, or other energy-conversion/production-based power source. In a preferred embodiment, the voltage source 51 provides a DC voltage, more preferably 5V DC, or 3.3V DC. In a preferred embodiment, the voltage source 51 is a voltage regulator (e.g. 7803, 7805, etc.) powered by a battery, or an AC-to-DC converter connected to the local power grid.

Other Electronics 30

The memory controller 15 contains other electronics 30 capable of determining whether the voltage between the first electrode 9 and the second electrode 11 exceeds the predefined voltage, using the one or more ADCs 29. Preferably, the other electronics 30 are capable of maintaining a voltage to the first electrode 9 and the second electrode 11 using the one or more DACs 27, in order to store or clear/overwrite data.

In one embodiment, the other electronics 30 also contains the electronics capable of controlling a light source optically connected to the semiconductor wire as described above.

Preferably, the other electronics 30 is an ASIC (Application Specific Integrated Circuit), microcontroller, computer, or other electronic device, more preferably also providing as the one or more ADCs 29 and the one or more DACs 27. In a preferred embodiment, the other electronics 30 is a microcontroller such as the ATMEGA128 sold by ATMEL.

The address input 53 is an electrical connection for the transfer of data representing a location of optical memory. Preferably, the other electronics 30 comprises a serial or parallel bus connected to the address input 53, whereby a memory storage location is selected by the other electronics 30 as requested at the address input 53. Preferably, the address input 53 is designed for connection with a computing device, for example a computer, microcontroller, cellular phone, PDA, laptop, etc. More specifically, the address input 53 is preferably designed for connection with an PATA, SATA, SCSI, USB, firewire, etc. connection of a computing device.

The data line 55 is an electrical connection for the transfer of data to be stored or the retrieval of stored data in optical memory. In an alternate embodiment, an input is used for the transfer of data to be stored in optical memory and an output is used to transfer data retrieved from the optical memory. Preferably, the other electronics 30 comprises a serial or parallel bus connected to the data line 55, whereby data stored or to be stored a memory storage location is transferred between the other electronics 30 to the data line 55 as requested at the address input 53. Preferably, the data line 55 is designed for connection with a computing device, for example a computer, microcontroller, cellular phone, PDA, laptop, etc. More specifically, the data line 55 is preferably designed for connection with a PATA, SATA, SCSI, USB, firewire, etc. connection of a computing device.

FIG. 3b

Figure 3B:
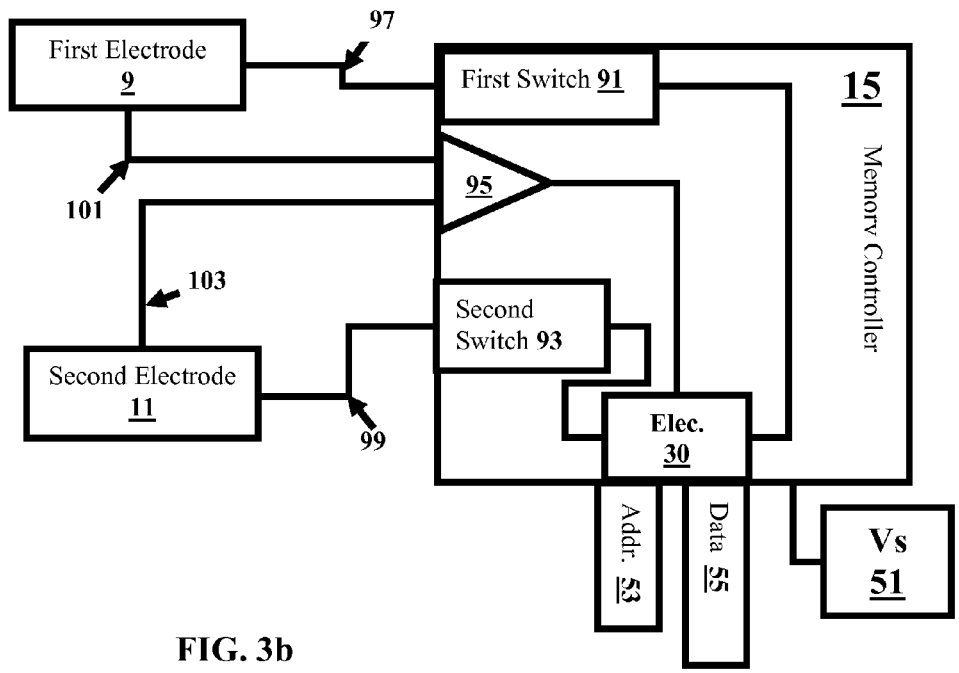
FIG. 3b depicts a block diagram of one embodiment of a memory controller comprising a comparator, a plurality of switches and other electronics.

FIG. 3b depicts a block diagram of one embodiment of a memory controller comprising a comparator, a plurality of switches and other electronics. In this embodiment, the memory controller 15 comprises a first switch 91, a second switch 93, and a Voltage Comparator 95 connected to other electronics 30. The first electrode 9 is electrically connected to the first switch 91 via a first switch wire 97. The second electrode 11 is electrically connected the second switch 93 via a second switch wire 99. The first electrode 9 is electrically connected to the Voltage Comparator 95 via a first Voltage Comparator wire 101. The second electrode 11 is electrically connected to the Voltage Comparator 95 via a second Voltage Comparator wire 103. A voltage source 51 provides a voltage to the memory controller 15. In a preferred embodiment, the memory controller 15 comprises an ASIC (Application Specific Integrated Circuit), microcontroller, computer, or other electronic device comprising a first switch 91, a second switch 93, a Voltage Comparator 95, and other electronics 30, preferably a microcontroller such as the ATMEGA128 sold by ATMEL. An address input 53 and a data line 55 are connected to the other electronics 30. The first electrode 9, the second electrode 11, the address input 53 and the data line 55, are as described above.

First Switch 91

The first switch 91 is any switching means controlled by the other electronics 30. Although not shown for clarity, the first switch 91 is electrically connected to the voltage source 51. Preferably, the first switch 91 is an electrical relay switch, a transistor, or other electrically controlled switch. In a preferred embodiment, the first switch 91 is a BJT, or MOSFET power transistor.

Second Switch 93

The second switch 93 is any switching means controlled by the other electronics 30. Although not shown for clarity, the second switch 93 is electrically connected to the voltage source 51. Preferably, the second switch 93 is an electrical rely switch, a transistor, or other electrically controlled switch. In a preferred embodiment, the second switch 93 is a BJT, or MOSFET power transistor.

Voltage Comparator 95

The voltage comparator 95 is a device capable of producing a signal representing the difference of the voltage at the first electrode 9 and the second electrode 11. Preferably, the voltage comparator 95, is an operational amplifier based comparator. In a preferred embodiment, the voltage comparator 95 is an LM339. In another preferred embodiment, the voltage comparator 95 is a voltage comparator integrated in a microcontroller.

Other Electronics 30

The memory controller 15 contains other electronics 30 capable of determining whether the voltage between the first electrode 9 and the second electrode 11 exceeds the predefined voltage, using the voltage comparator 95. Preferably, the other electronics 30 are capable of maintaining a voltage to the first electrode 9 and the second electrode 11 using the first switch 91 and the second switch 93, in order to store or clear/overwrite data.

In one embodiment, the other electronics 30 also contains the electronics capable of controlling a light source optically connected to the semiconductor wire as described above.

Preferably, the other electronics 30 is an ASIC (Application Specific Integrated Circuit), microcontroller, computer, or other electronic device, more preferably also providing as the first switch 91, the second switch 93, voltage comparator 95, or a combination thereof. In a preferred embodiment, the other electronics 30 is a microcontroller such as the ATMEGA128 sold by ATMEL.

The address input 53 is an electrical connection for the transfer of data representing a location of optical memory.

Preferably, the other electronics 30 comprises a serial or parallel bus connected to the address input 53, whereby a memory storage location is selected by the other electronics 30 as requested at the address input 53. Preferably, the address input 53 is designed for connection with a computing device, for example a computer, microcontroller, cellular phone, PDA, laptop, etc. More specifically, the address input 53 is preferably designed for connection with an PATA, SATA, SCSI, USB, firewire, etc. connection of a computing device.

The data line 55 is an electrical connection for the transfer of data to be stored or the retrieval of stored data in optical memory. In an alternate embodiment, an input is used for the transfer of data to be stored in optical memory and an output is used to transfer data retrieved from the optical memory. Preferably, the other electronics 30 comprises a serial or parallel bus connected to the data line 55, whereby data stored or to be stored a memory storage location is transferred between the other electronics 30 to the data line 55 as requested at the address input 53. Preferably, the data line 55 is designed for connection with a computing device, for example a computer, microcontroller, cellular phone, PDA, laptop, etc. More specifically, the data line 55 is preferably designed for connection with a PATA, SATA, SCSI, USB, firewire, etc. connection of a computing device.

FIG. 4a

Figure 4A:
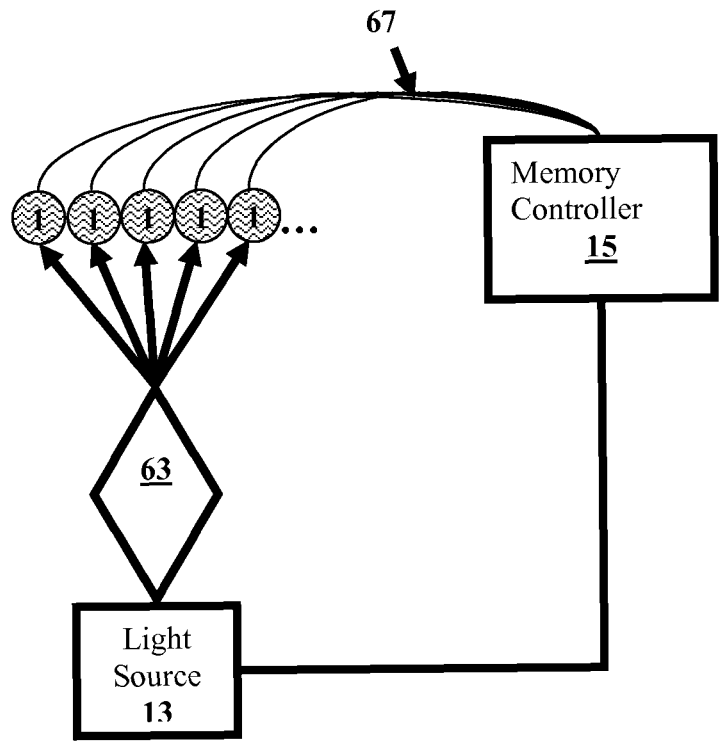
FIG. 4a depicts one embodiment of an optical memory device having a plurality of optical memory connected in parallel with an optical distributor.

FIG. 4a depicts one embodiment of an optical memory device having a plurality of optical memory connected in parallel with an optical distributor. In the embodiment shown in FIG. 4a, the memory controller 15 is connected to a light source 13. Light from the light source 13 passes to an optical distributor 63. Light is then distributed from the optical distributor 63 to a plurality of optical memory 1 via a plurality of optical fibers 67. Finally, each optical memory 1 is connected to the memory controller 15. In this embodiment, the memory controller 15, and the light source 13 are as described above. Preferably, the memory controller 15 has a plurality of DACs and ADCs as described above. Alternatively, the memory controller 15 comprises a multiplexor connecting a plurality of optical memory 1 to a single DAC, a single ADC, or a combination thereof.

The optical distributor 63 is any means of distributing light from a single source to a plurality of optical memory 1. Preferably, the optical distributor 63 is a rotating prism, mirror or other reflective object. In one embodiment, light reflected by the optical distributor 63 passes directly to the semiconductor wire of a corresponding optical memory 1. In an alternative embodiment, light reflected by the optical distributor 63 passes through one or more optical fibers and then to the semiconductor wire of a corresponding optical memory 1.

FIG. 4b

Figure 4B:
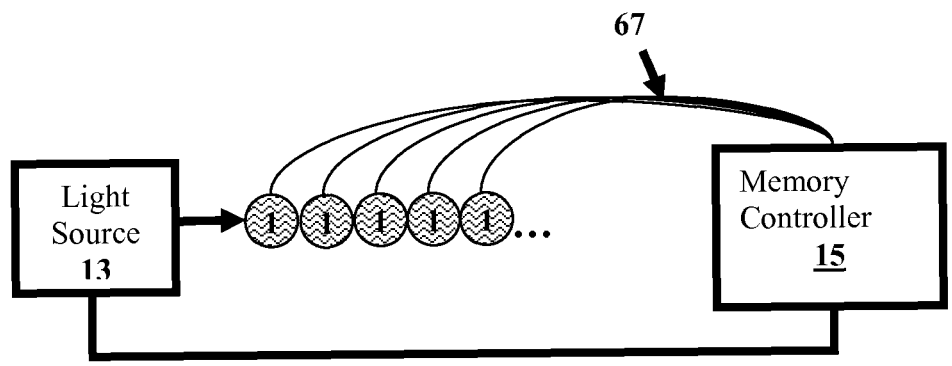
FIG. 4b depicts one embodiment of an optical memory device having a plurality of optical memory connected in series.

FIG. 4b depicts one embodiment of an optical memory device having a plurality of optical memory connected in series. In the embodiment shown in FIG. 4b, the memory controller 15 is connected to a light source 13. Light from the light source 13 passes through a plurality of optical memory 1 connected in series, whereby the light passes into a first optical memory, then into a second optical memory and so forth. Each optical memory 1 is connected to the memory controller 15. This embodiment is a preferred embodiment, when the data to be stored is in a time based signal, preferably a stream of data encoded as binary (light on/off) data in a time based signal.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

All publications and patent documents cited in this application are incorporated by reference in their entirety for all purposes to the same extent as if each individual publication or patent document were so individually denoted.

Any element in a claim that does not explicitly state "means for" performing a specified function, or "step for" performing a specific function, is not to be interpreted as a "means" or "step" clause as specified in 35 U.S.C. §112, ¶6. In particular, the use of "step of" in the claims herein is not intended to invoke the provisions of 35 U.S.C. §112, ¶6.

The invention claimed is:

1. Optical memory comprising:
   a. a semiconductor wire, a first electrode, a second electrode, a light source, a means for producing a first voltage at said first electrode, a means for producing a second voltage at said second electrode, and a means for determining the presence of an electrical voltage across said first electrode and said second electrode exceeding a predefined voltage;
   b. said semiconductor wire essentially optically transparent;
   c. said semiconductor wire having a bandgap less than the energy of the light produced by said light source;
   d. said light source optically connected to said semiconductor wire;
   e. said first electrode electrically conductive and electrically insulated from said semiconductor wire;
   f. said second electrode electrically conductive and electrically insulated from said semiconductor wire;
   g. said first electrode and said second electrode electrically insulated from each other;
   h. said first electrode and said second electrode positioned producing an electric field across said semiconductor wire; and
   i. said first voltage different from said second voltage.

2. The optical memory of claim 1 further comprising:
   a. at least part of said first electrode positioned at a distance less than 5 nm from said semiconductor wire; and
   b. at least part of said second electrode positioned at a distance less than 5 nm from said semiconductor wire.

3. The optical memory of claim 1 further comprising:
   a. said semiconductor wire having a bandgap greater than 0.5 ev.

4. The optical memory of claim 1 further comprising:
   a. said first voltage less than 0 volts.

5. The optical memory of claim 1 further comprising:
   a. said second voltage greater than 0 volts.

6. The optical memory of claim 1 further comprising:
   a. said first electrode comprising one or more digit sections running orthogonal to the length of said semiconductor wire;
   b. said second electrode comprising one or more digit sections running orthogonal to the length of said semiconductor wire;
   c. each said digit section of said first electrode positioned at a distance less than 5 nm from said semiconductor wire; and
   d. each said digit section of said second electrode positioned at a distance less than 5 nm from said semiconductor wire.

7. The optical memory of claim 6 further comprising:
a. said one or more digits sections of said first electrode is a plurality of digit sections;
b. each said digit section of said first electrode running orthogonal to the length of said semiconductor wire;
c. said one or more digit sections of said second electrode is a plurality of digit sections;
d. each said digit sections of said second electrode running orthogonal to the length of said semiconductor wire; and
e. each said digit section of said first electrode separated by a corresponding digit section from said second electrode.

8. The optical memory of claim 6 further comprising:
a. said one or more digits sections of said first electrode is a plurality of digit sections;
b. each said digit section of said first electrode running orthogonal to the length of said semiconductor wire;
c. said one or more digit sections of said second electrode is a plurality of digit sections;
d. each said digit sections of said second electrode running orthogonal to the length of said semiconductor wire; and
e. each said digit section of said second electrode separated by a corresponding digit section from said first electrode.

9. The optical memory of claim 1 further comprising:
a. said semiconductor wire made of a material comprising ZnO.

10. The optical memory of claim 1 further comprising:
a. $SiO_2$ electrically insulating said first electrode from said semiconductor wire; and
b. $SiO_2$ electrically insulating said second electrode from said semiconductor wire.

11. The optical memory of claim 1 further comprising:
a. a substrate and an insulating layer;
b. said first electrode positioned exterior to said insulating layer;
c. said substrate positioned exterior to said insulating layer;
d. said second electrode positioned exterior to said insulating layer; and
e. said insulating layer surrounding said semiconductor wire, whereby said semiconductor wire is electrically insulated from said first electrode and said second electrode.

12. The optical memory of claim 11 further comprising:
a. said substrate comprising Si;
b. said insulating layer comprising $SiO_2$; and
c. said semiconductor wire comprising ZnO.

13. The optical memory of claim 1 further comprising:
a. said first electrode comprising a planar shape;
b. said second electrode comprising a planar shape; and
c. said planar shape of said first electrode coplanar with said planar shape of said second electrode.

14. The optical memory of claim 1 further comprising:
a. a plurality of said semiconductor wire;
b. a plurality of said first electrode;
c. a plurality of said second electrode; and
d. each said semiconductor wire having a corresponding first electrode and a corresponding second electrode.

15. The optical memory of claim 1 further comprising:
a. a memory controller and a voltage source;
b. said voltage source electrically connected to said memory controller;
c. said memory controller comprising a first switch, a voltage comparator, a second switch, an address input, and a data line;
d. said means for producing a first voltage comprising said first switch;
e. said means for producing a second voltage comprising said second switch; and
f. said means for detecting the electrical voltage across said first electrode and said second electrode comprising said voltage comparator.

16. The optical memory of claim 1 further comprising:
a. a memory controller and a voltage source;
b. said voltage source electrically connected to said memory controller;
c. said memory controller comprising one or more ADCs (analog-to-digital-converters), one or more DACs (digital-to-analog-converters), an address input, and a data line;
d. said means for producing a first voltage comprising said one or more DACs (Digital-to-analog-converters) of said memory controller;
e. said means for producing a second voltage comprising said one or more DACs (digital-to-analog-converters) of said memory controller; and
f. said means for detecting the electrical voltage across said first electrode and said second electrode comprising said one or more ADCs (Analog-to-digital-converters) of said memory controller.

17. The optical memory of claim 1 further comprising:
a. at least part of said first electrode positioned at a distance less than 5 nm from said semiconductor wire;
b. at least part of said second electrode positioned at a distance less than 5 nm from said semiconductor wire;
c. said semiconductor wire having a bandgap greater than 0.5 ev;
d. said first voltage less than 0 volts; and
e. said second voltage greater than 0 volts.

18. The optical memory of claim 17 further comprising:
a. said first electrode comprising one or more digit sections running orthogonal to the length of said semiconductor wire;
b. said second electrode comprising one or more digit sections running orthogonal to the length of said semiconductor wire;
c. each said digit section of said first electrode positioned at a distance less than 5 nm from said semiconductor wire;
d. each said digit section of said second electrode positioned at a distance less than 5 nm from said semiconductor wire;
e. said one or more digits sections of said first electrode is a plurality of digit sections;
f. each said digit section of said first electrode running orthogonal to the length of said semiconductor wire;
g. said one or more digit sections of said second electrode is a plurality of digit sections;
h. each said digit sections of said second electrode running orthogonal to the length of said semiconductor wire; and
i. each said digit section of said first electrode separated by a corresponding digit section from said second electrode.

19. The optical memory of claim 18 further comprising:
a. said first electrode comprising one or more digit sections running orthogonal to the length of said semiconductor wire;
b. said second electrode comprising one or more digit sections running orthogonal to the length of said semiconductor wire;
c. each said digit section of said first electrode positioned at a distance less than 5 nm from said semiconductor wire;
d. each said digit section of said second electrode positioned at a distance less than 5 nm from said semiconductor wire;

e. said one or more digits sections of said first electrode is a plurality of digit sections;
f. each said digit section of said first electrode running orthogonal to the length of said semiconductor wire;
g. said one or more digit sections of said second electrode is a plurality of digit sections;
h. each said digit sections of said second electrode running orthogonal to the length of said semiconductor wire; and
i. each said digit section of said second electrode separated by a corresponding digit section from said first electrode.

20. The optical memory of claim 19 further comprising:
a. said semiconductor wire is made of a material comprising ZnO;
b. $SiO_2$ electrically insulating said first electrode from said semiconductor wire; and
c. $SiO_2$ electrically insulating said first electrode from said semiconductor wire.

21. The optical memory of claim 20 further comprising:
a. a substrate comprising Si;
b. an insulating layer comprising $SiO_2$;
c. said insulating layer positioned between said first electrode and said substrate;
d. said insulating layer positioned between said second electrode and said substrate; and
e. said semiconductor wire positioned within said insulating layer whereby said semiconductor wire is electrically insulated from said first electrode and said second electrode.

22. The optical memory of claim 21 further comprising:
a. said substrate, said insulating layer, and said first electrode and said second electrode having a combined thickness less than 50 nm.

* * * * *